US006275091B1

United States Patent
Saeki

(10) Patent No.: US 6,275,091 B1
(45) Date of Patent: Aug. 14, 2001

(54) CLOCK SIGNAL CONTROL CIRCUIT AND METHOD AND SYNCHRONOUS DELAY CIRCUIT

(75) Inventor: Takanori Saeki, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/620,378

(22) Filed: Jul. 20, 2000

(30) Foreign Application Priority Data

Jul. 23, 1999 (JP) .................................................. 11-208540

(51) Int. Cl.[7] .................................................. H03K 17/296
(52) U.S. Cl. ............................ 327/396; 327/277; 327/399
(58) Field of Search ..................................... 327/141, 144, 327/153, 161, 264, 266, 276, 277, 278, 280, 281, 284, 285, 287, 288, 392, 396, 399–401

(56) References Cited

U.S. PATENT DOCUMENTS 4,899,071 * 2/1990 Morales ................................ 327/277
5,644,261 * 7/1997 Frisch et al. ......................... 327/276
5,945,861 * 8/1999 Lee et al. .............................. 327/152
6,075,395 * 6/2000 Saeki .................................... 327/161

OTHER PUBLICATIONS

IEICE Trans. Electron., "Digital Delay Locked Loop and Design Technique for High–Speed Synchronous Interface", vol. E79–C, No. 6, Jun. 1996, pp. 798–803.
ISSCC Digest of Technical Papers 24.5, Feb. 1999.

* cited by examiner

Primary Examiner—My-Trang Nu ton
(74) Attorney, Agent, or Firm—Young & Thompson

(57) ABSTRACT

A clock signal control circuit that permits the on-chip circuit dimensional size to be reduced is provided. The clock signal control circuit includes a plurality of amplifier circuit elements amplifying the input clock signal and a plurality of switching elements switching the passage of the clock signal on and off, wherein the plurality of amplifier circuit elements and the plurality of switching elements are connected in such a way that the amplifier circuit elements may be connected in a series fashion when they are operational. Selecting those switching elements that are switched on causes the amplifier circuit elements to be switched so that their series-fashion connection can be reversed to allow the clock signal to travel in the backward direction.

19 Claims, 9 Drawing Sheets

CLOCK SIGNAL CONTROL CIRCUIT AND METHOD AND SYNCHRONOUS DELAY CIRCUIT

FIELD OF THE INVENTION

The present invention relates to a clock signal control circuit and method, and more particularly to a clock signal control circuit that is suited best to be used as a synchronous delay circuit.

BACKGROUND OF THE INVENTION

A circuit for changing the direction in which a clock signal is traveling is known in the prior art. For example, document (1) (IEICE Trans. Electron., Vol. E79-C, No. 6, June 1996, pp798–803) discloses the arrangement of such circuit that is shown in FIG. 3.

Referring to FIG. 3, the circuit includes two groups of individual clocked inverters 31 wherein the first group of individual clocked inverters is connected to allow a clock signal to travel in the forward direction, and the second group of individual clocked inverters is connected to allow the clock signal to travel in the backward direction, with each respective node of the adjacent clocked inverters in the first group being coupled with each respective corresponding node of the adjacent clocked inverters in the second group. When the clock signal travels in the forward direction from a terminal FIN toward a terminal FOUT, the forward clocked inverter sequence 30A may be enabled by setting a control signal D to High level and by setting a complementary (inversed) signal DB for the control signal to Low level, thereby causing each individual clocked inverters in the backward clocked inverter sequence 30B to be placed in Hi-Z state (floating state). When the clock signal travels in the backward direction from a terminal BIN to a terminal BOUT, on the other hand, the backward clocked inverter sequence 30B may be enabled by setting the control signal D to Low level and by setting the complementary signal DB to High level, thereby causing each individual clocked inverter in the forward inverter sequence 30A to be placed in Hi-Z state.

It may be understood from the above document that each of the forward clocked inverters includes P-type channel MOS transistors (PM31 to PM34), inverters INV31 to INV34 and N-type channel MOS transistors NM31 to NM34, respectively, each of which is connected in series between power supply VCC and ground GND. The control signal D may be applied to the gate of each of N-type channel MOS transistors NM31 to NM34, and a signal that may be obtained by inversing the control signal D at the inverter INV39 may be applied to the gate of each of P-type channel MOS transistors PM31 to PM34. For the backward clocked inverter sequence, each clocked inverter includes P-type channel MOS transistors PM35 to PM38, inverters INV35 to INV38 and N-type channel MOS transistors NM35 to NM38, respectively, each of which is connected in series between power supply VCC and ground GND, respectively. The control signal DB may be applied to the gate of each N-type channel MOS transistor NM35 to NM38, and a signal that may be obtained by reversing the control signal DB at the inverter INV39 may be applied to the gate of each P-type channel MOS transistor PM35 to PM38. The input node and output node of each clocked inverter in the forward clocked inverter sequence is connected to the output node and input node of each corresponding clocked inverter in the backward clocked inverter sequence, respectively.

FIG. 4 shows a typical synchronous delay circuit that incorporates two equivalent delay circuits shown in FIG. 3 and described above. Specifically, this synchronous delay circuit includes a first delay circuit 48 and a second delay circuit 49, both of which are identical to that shown in FIG. 3. Each of the first and second delay circuits includes forward and backward clocked inverter sequences (48A, 48B; 49A, 49B), respectively, and may be operated under control of the control signal to switch the direction in which the clock signal travels between forward and backward. The synchronous delay circuit further includes an input buffer 47 that may receive input clock 41, a third delay circuit 43 that may receive an output of the input buffer 47 as input and provide a delayed output that may be fed to an input terminal of each individual clocked inverter in the forward clocked inverter sequences 48A, 49A within the first and second delay circuits 48, 49, respectively, a frequency divider 45 that may accept the output of the input buffer 47 and provide a frequency-divided output, NAND gate 46 to which the output of each of the clocked inverters in the backward clocked inverter sequences 48B, 49B within the first and second delay circuits 48, 49 may be applied, and a clock buffer 44 that may receive an output of NAND gate 46.

The output signal from the frequency divider 45, whose frequency is equal to half the frequency of the input clock, and the output signal of the inverter 40, which is equivalent to the inversed version of the output signal of the frequency divider, may be used as control signals D and DB, respectively, that cause the individual clocked inverters in the forward and backward clocked inverter sequences 48A, 48B within the first delay circuit 48 to be switched on and off, respectively. In addition, the signal that may be obtained by enabling the inverter 40 to reverse the output signal of the frequency divider 45, having a frequency equal to half the frequency of the input clock, and the signal of the frequency divider 45 that is equal to half the frequency of the input clock may be used as control signals DB and D, respectively. Thus, when the control signal D is at High level, the clocked inverters in the forward clocked inverter sequence 48A within the first delay circuit 48 and the clocked inverters in the backward clocked inverter sequence 49B within the second delay circuit 49 may be switched on. When the control signal D is at Low level, the individual clocked inverters in the backward clocked inverter sequence 48B within the first delay circuit 48 and the individual clocked inverters in the forward clocked inverter sequence 49A within the second delay circuit 49 may be switched on. In this way, the direction in which the clock signal is traveling through the first and second delay circuits 48, 49, respectively, may be switched over alternately between forward and backward at every cycle of the input clock signal.

As this time, the clock signal may be delayed by a predetermined delay time T by the delay circuit 43 before it passes through the respective delay circuits 48, 49.

FIG. 5 is a timing diagram that may be used in explaining the operation of the synchronous delay circuit of FIG. 4. As shown in FIG. 5, the clock signal that travels in opposite directions through the first and second delay circuits 48, 49, respectively, has a delay time that occurs earlier by a delay time T of the delay circuit 43, with respect to the sum of a delay time d1 of the input buffer 47 and a delay time d2 of a clock buffer 44, i.e., d1+d2.

More specifically, the input clock may be delayed by the delay time of d1 by the input buffer 47 (see FIG. 5(b)), and may further be delayed by the time T by the delay circuit 43 (see FIG. 5(c)). Thus, when the control signal D is at High level, the control signal D that is traveling through the first forward clocked inverter sequence 48A within the first delay circuit 48 will advance up to the point (timing of tCK−T) where the clock signal D changes to Low level, and at this advance point (timing), it is transferred to the backward clocked inverter sequence 48B within the first delay circuit 48. Then, the clock signal D travels through the backward clocked inverter sequence 48B within the delay circuit 48, advancing by a time length of tCK−T where an output may be provided at the output terminal (see BOUT in FIG. 3). Thus, the output of the first delay circuit 48 may be delayed by the delay of tCK−T with regard to the falling edge of the control signal D (see FIG. 5(f), where tN=T). The output of the second delay circuit 49 may be delayed by a delay of tCK−T with regard to the rising edge of the control signal DB (see FIG. 5(g)).

The NAND gate 46 provides output of Low level when the output of the first and second delay circuits 48, 49 is at High level, and the output of the NAND gate 46 may be provided through the clock buffer 44 that delays the output by a delay time d2. Specifically, by setting the delay time T of the delay circuit 43 equal to the sum of the delay time d1 of the input buffer 47 and delay time d2 of the clock buffer 44, the resulting output clock 42 may have a phase that is synchronized with the rising edge of the input clock 41.

SUMMARY OF THE DISCLOSURE

In the aforementioned prior art, there is much to be desired which will be further analyzed hereinbelow.

According to the conventional typical synchronous delay circuit described so far, however, the clocked inverters forming the first and second delay circuits, respectively, must include two sets (serieses) of clocked inverters, that is, a total of eight transistors in the forward and backward traveling paths, and those are the minimum requirements for configuring a repeating unit of the delay elements. Namely, as shown in FIG. 3, one clocked inverter includes a CMOS inverter (two transistors), and a P-type channel MOS transistor and a N-type channel MOS transistor connected between the CMOS inverter and the power supply lines, that is, a total of four transistors.

With the conventional synchronous delay circuit arrangement shown in FIG. 4, if a longer time is intended for the clock signal to travel along the forward and backward paths through the first and second delay circuits, the stages of the delay elements included in the clocked inverters must be increased, and the number of transistor elements must be increased as a function of the clock cycle period. The size of the on-chip circuit must be increased accordingly.

In order to solve the above problem and therefore in an attempt to reduce the number of elements involved, another document 2 (ISSCC Digest of Technical Papers 24.5, February, 1999) proposes an arrangement, as shown FIGS. 6 through 8, that includes clocked inverters formed by P-type channel MOS transistors and N-type channel MOS transistors which are separated from each other, in order to permit only the edge of the clock signal to travel. In FIGS. 6 through 8, those transistor elements that are shown to be connected by dashed lines (reference symbols such as PM, NM, etc. are not shown) represent the elements that have actually been omitted).

Referring first to FIG. 6, each of the forward and backward delay circuits comprises clocked inverter sequences, respectively, which include a clocked inverter formed by N-type channel MOS transistors and P-type channel MOS transistors, respectively, and which are alternately disposed and separated from each other. Specifically, the forward clocked inverter sequence includes a first stage clocked inverter that is formed by an N-type channel MOS transistor NM52 having its source coupled with ground and its gate to which a control signal D is applied, and an N-type channel MOS transistor NM51 having its gate to which a clock signal is applied and its source coupled with the drain of the N-type channel MOS transistor NM52; and a second clocked inverter that is formed by P-type channel MOS transistor PM52 having its gate coupled with the drain of the N-type channel MOS transistor NM51 in the pre-stage (first stage) clocked inverter and its drain coupled with the next-stage input terminal (or output terminal), and P-type channel MOS transistor PM51 whose source is coupled with the power supply and having its gate to which the inversed version of the control signal D is applied and its drain coupled with the source of the P-type channel MOS transistor PM52. Thus, the clocked inverters including N-type channel MOS transistors and P-type channel MOS transistors are separated from each other and disposed alternately one stage to another. The above applies similarly to the backward clocked inverter sequences.

Referring next to FIG. 7, there is shown another circuit arrangement that comprises forward and backward clocked inverters including P-type channel MOS transistor and N-type channel MOS transistor, respectively, wherein the forward and backward clocked inverters overlap each other. For example, N-type channel MOS transistor NM61 having its gate to which clock signal FIN is applied, and N-type channel MOS transistor NM62 having its source coupled with ground, its drain coupled with the source FIN of the N-type channel MOS transistor NM61 and its gate to which control signal D is applied to form a forward clocked inverter. On the other hand, the backward clocked inverter is formed by P-type channel MOS transistor PM61 having its gate receiving the control signal D and its source coupled with power supply VCC, and P-type channel MOS transistor PM62 having its gate receiving clock signal output (FOUT), from the second-stage inverter unit and its source coupled with the drain of the P-type channel MOS transistor PM61. The drain of N-type channel MOS transistor NM61 is connected with the drain of P-type channel MOS transistor PM62, which drain is further connected to gate of PM64 of the second-stage inverter unit. The output clock signal FOUT of the second-stage inverter unit is taken at drain of PM64 connected to drain of NM63. The second stage inverter unit (NM63, NM64, PM63, PM64) is configured equivalent to the first stage unit (NM61, NM62, PM63, PM64) provided that BIN and FOUT correspond to FIN and BOUT, respectively.

Referring finally to FIG. 8, there is shown a latch circuit arrangement that comprises forward and backward clocked inverters including P-type channel MOS transistor and N-type channel MOS transistor, respectively, the forward and backward clocked inverters overlapping each other. For example, N-type channel MOS transistor NM71 having its gate receiving clock signal FIN, and N-type channel MOS transistor NM72 having its source coupled with ground, its drain coupled with the source of N-type channel MOS transistor NM71, and its gate receiving control signal D form the forward clocked inverter. On the other hand, P-type channel MOS transistor PM71 having its gate receiving control signal D and its source coupled with power supply, and P-type channel MOS transistor PM72 having its gate receiving an output clock signal from the next-stage is applied and its source coupled with the drain of P-type channel MOS transistor PM71 form the backward clocked inverter. The drain of N-type channel MOS transistor NM71 and the drain of P-type channel MOS transistor PM72 are coupled with each other, and are coupled with the gate of P-type channel MOS transistor PM74 in the next stage forward clocked inverter. Similarly, the drain of N-type channel MOS transistor NM73 and the drain of P-type channel MOS transistor PM74 are coupled with each other, and are also coupled with the gate of P-type channel MOS transistor PM72 in the first stage forward clocked inverter.

In any of the circuit arrangements shown in FIGS. 6 through 8, in which the clocked inverter sequence is formed from the number of transistors that corresponds to half the number of elements in the arrangement shown in FIG. 3, the clock signal path cannot avoid occurrence of floating nodes.

To avoid the above problem, an alternative circuit arrangement that includes additional transistors (PM82, NM83 etc.) may be employed as shown in FIG. 9, but the number of elements that can be reduced is limited to three-fourth (¾) of the number of elements in the arrangement shown in FIG. 3.

Referring then to FIG. 9, the forward clocked inverter sequence 80A includes P-type channel MOS transistor PM81 having its source coupled with power supply and its gate receiving an inversed version of control signal D, and P-type channel MOS transistor PM83 having its gate receiving clock signal FIN, its source coupled with the drain of P-type channel MOS transistor PM81, and its drain from which the signal is conveyed to a next-stage clocked inverter including N-type channel MOS transistors, wherein it further includes an additional P-type channel MOS transistor PM82 in parallel with P-type channel MOS transistor PM81 coupled between power supply VCC and the source of P-type channel MOS transistor PM83, and having its gate coupled with a source of P-type channel MOS transistor PM86 in the clocked inverter located two stages downstream. Similarly, the clocked inverter including N-type channel MOS transistors additionally includes N-type channel MOS transistor NM83 having its gate receiving a clock signal (drain output of PM83), and N-type channel MOS transistor NM83 in parallel with N-type channel MOS transistor NM82 having its gate receiving the control signal D, its drain coupled with the source of N-type channel MOS transistor NM81 and its source coupled with ground, wherein the gate of N-type channel MOS transistor NM83 is coupled with the source of N-type channel MOS transistor NM84 in a clocked inverter located two stages downstream.

Although the delay circuit shown in FIG. 9 may include more stages of forward and backward clocked inverter sequences, the number of transistor elements that may be reduced is also limited to three-fourth (¾) of that in the circuit of FIG. 3.

The present invention addresses the problems mentioned hereinabove, and it is therefore an object of the present invention to provide a clock signal control circuit and method, and a delay circuit, wherein the number of circuit elements used may be reduced and the overall size of the on-chip circuit may be reduced accordingly.

According to a first aspect of the invention, there is provided a clock signal control circuit for a delay circuit.

The delay circuit includes a plurality of amplifier circuit elements that are capable of amplifying an input clock signal, and a plurality of switching elements that are capable of switching the passage of the clock signal on and off. During the operation, the plurality of amplifier circuit elements may be connected in a series fashion through the switching elements that are switched on, and the direction in which the clock signal is traveling through said series-connected plurality of amplifier circuit elements may be switched between forward and backward, by selecting those switching elements that are switched on.

The selected series fashioned connection is established typically as a meander-like path by selecting the switching elements ON, time to time, appropriately.

In another aspect, the present invention provides a clock signal control method for a delay circuit that comprises a plurality of amplifier circuit elements that are capable of amplifying an input clock signal, and a plurality of switching elements that are capable of switching passage of a clock signal on and off, wherein the clock signal control method includes the steps of connecting the plurality of amplifier circuit elements in a series fashion through the switching elements that are switched on, and selecting the switched-on switching elements whereby the direction in which the clock signal is traveling through said plurality of amplifier circuit elements may be switched between forward and backward.

According to a third aspect, the switching elements are preferably disposed in parallel two lines with the amplifier circuit elements intervening between the two lines, wherein any of the forward and backward directions is selected by selectively establishing a meander-like path of the series fashion.

According to a fourth aspect, typically one of the two directions is established by connecting adjacent two of the amplifier circuit elements via one of the switching elements selected to be ON to form one meander-like path, while the other of the two direction is established by connecting the adjacent two amplifier circuit elements via another one of the switching elements selected to be ON disposed opposing to the one of the switching elements now selected to be OFF.

According to a fifth aspect, the amplifier circuit element comprises an inverter circuit; and the switching element comprises a MOS semiconductor switch.

According to a sixth aspect, the switching element comprises N-type channel MOS transfer gate and P-type channel MOS transfer gate, the transfer gates being controlled on and off according to the direction in which the clock signal is traveling.

According to seventh aspect, there is provided a specific delay circuit. The delay circuit comprises:

(a) a first group of switching elements connected in series between a first input terminal and a first output terminal and including switching elements alternately controlled to be switched on and off by a control signal or the control signal and a complementary signal thereof for switching passage of a clock signal on and off;

(b) a second group of switching elements connected in series between a second input terminal and a second output terminal and including switching elements alternately controlled to be switched on and off by a control signal or the control signal and a complementary signal thereof for switching passage of a clock signal on and off; and (c) a plurality of amplifier circuit elements connected between the respective junction nodes of the adjacent switching elements of the first group and the respective corresponding junction nodes of the adjacent amplifier circuit elements of the second group in such a way that one of the plurality amplifier circuit elements is connected forwardly or reversely alternately one to another, (d) wherein the plurality of amplifier circuit elements are connected in a series fashion through the switching elements that are switched on, and are shared by respective signal paths (i) between the first input terminal and the first output terminal and (ii) between the second input terminal and the second output terminal, and (e) wherein a direction in which the clock signal is traveling along the respective signal paths may be switched between a first direction from the first input terminal toward the first output terminal and a second direction from the second input terminal toward the second output terminal, by selecting the switching elements that are switched on.

According to an eighth aspect, there is provided a further delay circuit. The delay circuit comprises:

(a) a first group of switching elements including a first type of switching elements and a second type of switching elements controlled to be switched on and off by a control signal and a complementary signal thereof, the switching elements of the first type and the switching elements of the second type being connected in series from a first input terminal toward a first output terminal such that each switching element of one type is followed by each switching element of the other type in an alternate manner;

(b) a second group of switching elements including a second type of switching elements and a first type of switching elements control led to be switched on and off by a control signal and a complementary signal thereof, the switching elements of the second type and the switching elements of the first type being connected in series from a second input terminal located on the side of the first input terminal toward a second output terminal located on the side of the first output terminal such that each switching element of one type is followed by each switching element of the other type in an alternate manner; and (c) a plurality of amplifier circuit elements connected between each respective junction node of the adjacent switching elements in the first group of switching elements and each respective corresponding junction node of the adjacent switching elements in the second group of switching elements, each alternate one of the plurality of amplifier circuit elements having its input terminal and its output terminal connected (i) between the each respective junction node of the adjacent switching elements in the first group of switching element and the each respective junction node of the adjacent switching elements in the second group of switching elements and (ii) between the each respective junction node of the adjacent switching elements in the second group of switching elements and the each respective junction node of the adjacent switching elements in the first group of switching elements, respectively.

In this aspect, the following operation is possible:

(i) when the control signal is active, it causes the switching elements of the first type to be switched on, allowing the clock signal applied to the first input terminal to travel from the first input terminal toward the first output terminal through the switching elements of the first type that are switched on and the amplifier circuit elements, and (ii) when the complementary signal of the control signal is active, it causes the switching elements of the second type to be switched on, allowing the clock signal applied to the second input terminal to travel from the second input terminal toward the second output terminal through the switching elements of the second type that are switched on and the amplifier circuit elements.

In a variant operation, the following is possible:

(d) the first group of switching elements are connected in series between the first input terminal and the first output terminal through a first-stage switching element of the first type, followed by a second-stage switching element of the second type, followed further in an alternate fashion, and finally followed by a final-stage switching element of the first type; and (e) the second group of switching elements are connected in series between the second input terminal and the second output terminal through a first-stage switching element of the second type, followed by a second-stage switching element of the first type, followed further in an alternate fashion, and finally followed by a final-stage switching element of the second type, (f) wherein (i) when the control signal is active, it causes the switching element of the first type in the first and second group of switching elements to be switched on, allowing the clock signal applied to the first input terminal to travel through the switching elements of the first type thus switched on and through the amplifier circuit elements and then appear on the first output terminal, and (ii) when a complementary signal of the control signal is active, it causes the switching elements of the second type in the first and second group of switching elements to be switched on, allowing the clock signal to travel through the switching elements of the second type and through the amplifier circuit elements and appear on the second output terminal.

According to a ninth aspect, there is provided another delay circuit.

The delay circuit comprises:

(a) a first group of switching elements including a first type of switching elements and a second type of switching elements controlled to be switched on and off by a control signal when it is active, each alternate one of the switching elements of the first type and the switching elements of the second type being connected in series between a first input terminal and a first output terminal along this direction;

(b) a second group of switching elements including a second type of switching elements and a first type of switching elements controlled to be switched on and off, respectively, by a control signal when it is inactive, each alternate one of the switching elements of the second type and the switching elements of the first type being connected in series between a second input terminal located on the side of the first output terminal and a second output terminal located on the side of the first input terminal along this direction; and (c) a plurality of amplifier circuit elements connected between each respective junction node of the adjacent switching elements in the first group of switching elements and each respective corresponding junction node of the adjacent switching elements in the second group of switching elements, each alternate one of the plurality of amplifier circuit elements having its input terminal and its output terminal connected in an alternate fashion, (i) between the each respective junction node of the adjacent switching elements in the first group of switching element and the each respective junction node of the adjacent switching elements in the second group of switching elements and (ii) between the each respective junction node of the adjacent switching elements in the second group of switching elements and the each respective junction node of the adjacent switching elements in the first group of switching elements, respectively.

According to a tenth aspect, there is provided a further variant of a delay circuit.

The delay circuit comprises:
(a) a first group of switching elements including P-type channel MOS transistors and N-type channel MOS transistors connected in series between a first input terminal and a first output terminal in such a way that each alternate one of the transistors of one type is followed by each alternate one of the transistors of the other type, and controlled so that the transistors of the one type may be turned off when the transistors of the other type are turned on, in accordance with a predetermined value of a control signal;
(b) a second group of switching elements including P-type channel MOS transistors and N-type channel MOS transistors connected in series between a second input terminal located on the side of the first output terminal and a second output terminal located on the side of the first input terminal in such a way that each alternate one of the transistors of one type is followed by each alternate one of the transistors of the other type, and controlled so that the transistors of the one type may be turned off when the transistors of the other type are turned on, in accordance with a predetermined value of a complementary signal of the control signal that is reversed by an inverter; and
(c) a plurality of inverter circuits connected between each respective junction node of the adjacent transistors in the first group of switching elements and each respective corresponding junction node of the adjacent transistors in the second group of switching elements, each alternate one of the plurality of inverter circuits having its input terminal and its output terminal connected, in an alternate fashion, (i) between the each respective junction node of the adjacent transistors in the first group of switching element and the each respective junction node of the adjacent transistors in the second group of switching elements and (ii) between the each respective junction node of the adjacent transistors in the second group of switching elements and the each respective junction node of the adjacent transistors in the first group of switching elements, respectively.

In this aspect, those transistors connected in series along a forward signal traveling path from the first input terminal toward the first output terminal, and those transistors connected in series along a backward signal traveling path from the second input terminal toward the second output terminal may have different current driving capabilities.

According to an eleventh aspect, there is provided a synchronous delay circuit comprising: first and second delay circuits according to the aforementioned 7th to 10th aspects, wherein the first and second delay circuits are controlled by the control signal so that the direction in which a clock signal is traveling may be switched over between the forward direction and the backward direction.

The synchronous delay circuit includes:
an input buffer circuit to which an input clock signal is applied;
a third delay circuit configured for delaying an output of the input buffer circuit;
a frequency divider configured for dividing the output of the input buffer circuit by half,
an output of the frequency divider and its inversed version being fed to the first and second delay circuits as the control signal and the complementary signal thereof, respectively, and an output of the third delay circuit being fed to the respective first input terminals of the first and second delay circuits;
a logical gate circuit to which the output signals of the first and second delay circuits provided through their respective output terminals are applied; and
an output buffer circuit to which an output of the logical gate circuit is applied and which provides an output clock to be fed to appropriate clocking destination.

PREFERRED EMBODIMENTS OF THE INVENTION

Figure 1:
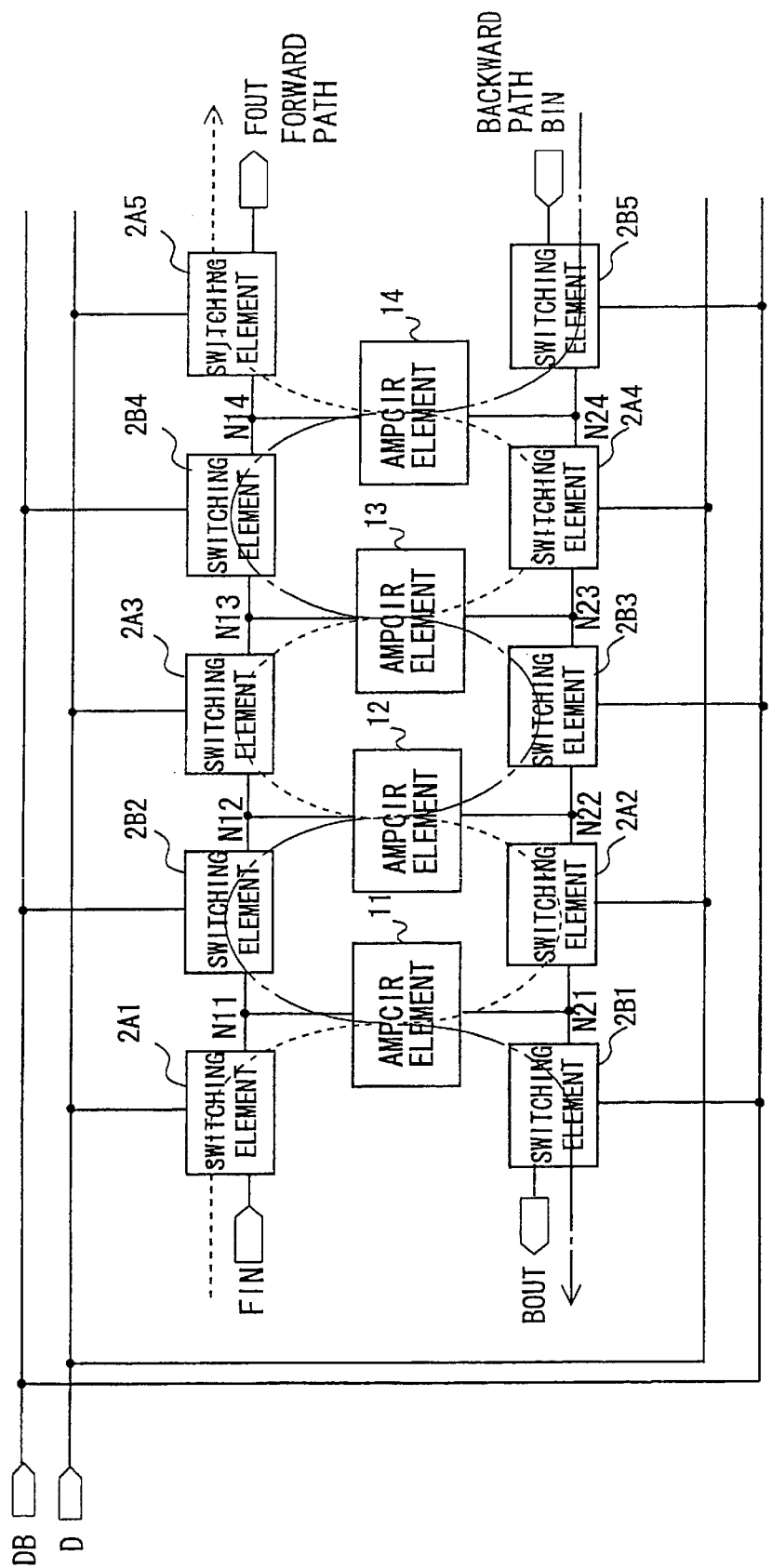
FIG. 1 is a schematic block diagram illustrating the circuit arrangement according to one embodiment of the present invention.

The embodiments of the present invention are now described. Referring first to FIG. 1, one embodiment of the present invention includes a plurality of amplifier circuit elements (1) that are capable of amplifying a clock signal applied thereto, and a plurality of switching elements (2A1 to 2A5, 2B1 to 2B5) that are capable of switching the passage of the clock signal on and off. Those amplifier circuit elements (11 to 14) and those switching elements (2) are connected so that the amplifier circuit elements (1) may be connected in a series fashion when they are operated. The switching elements (2A1 to 2A5 or 2B1 to 2B5) may be switched on by a control signal (D) and a complementary signal (DB) that is a reversed version of the control signal (D). Selecting those switching elements (2A1 to 2A5 or 2B1 to 2B5) that are thus switched on allows the direction in which the amplifier circuit elements (11 to 14) are connected in series to be switched from the forward direction (from input terminal FIN toward output terminal FOUT) to the backward direction (from input terminal BIN toward output terminal BOUT), or vice versa.

More specifically, a first group of switching elements (2A1, 2B2, 2A3, 2B4, 2A5) are connected between a first input terminal (FIN) and a first output terminal (FOUT), and may be switched on and off by the control signal (D) and its complementary signal (DB) alternately, thereby switching the passage of a clock signal on and off, a second group of switching elements (2B5, 2A4, 2B3, 2A2, 2B1) are connected between a second input terminal (BIN) and a second output terminal (BOUT), and may be switched on and off by the control signal (D) and its complementary signal alternately, thereby switching the passage of the clock signal on and off, and a plurality of amplifier circuit elements (11 to 14) are connected between nodes of the first group of switching elements and nodes of the second group of switching elements in such a way that each one is connected alternately forwardly or backwardly between the respective nodes. Those amplifier circuit elements are capable of being connected in a series fashion through the switching elements that are switched on, and may be shared by a signal path between the first input terminal (FIN) and first output terminal (FOUT) and by a signal path between the second input terminal (BIN) and second output terminal (BOUT). By selecting those switching elements that are thus switched on, the direction in which the signal is traveling may be switched over between the first signal path from the first input terminal (FIN) to the first output terminal (FOUT) and the second signal path from the second input terminal (BIN) to the second output terminal (BOUT).

In a preferred embodiment of the present invention, the amplifier circuit element (11 to 14) may be implemented by an inverter circuit, and the switching element may be implemented by a MOS semiconductor switch. The switching element may include transfer gates formed by N-type channel MOS transistors and control led to be on and off (referred to as "N-type channel MOS transfer gates") , and transfer gates formed by P-type channel MOS transistors and control led to be on and off (referred to as "P-type channel MOS transfer gates"). This arrangement provides a simple alternate ON and OFF switching line of the series-connected switching elements.

Figure 2:
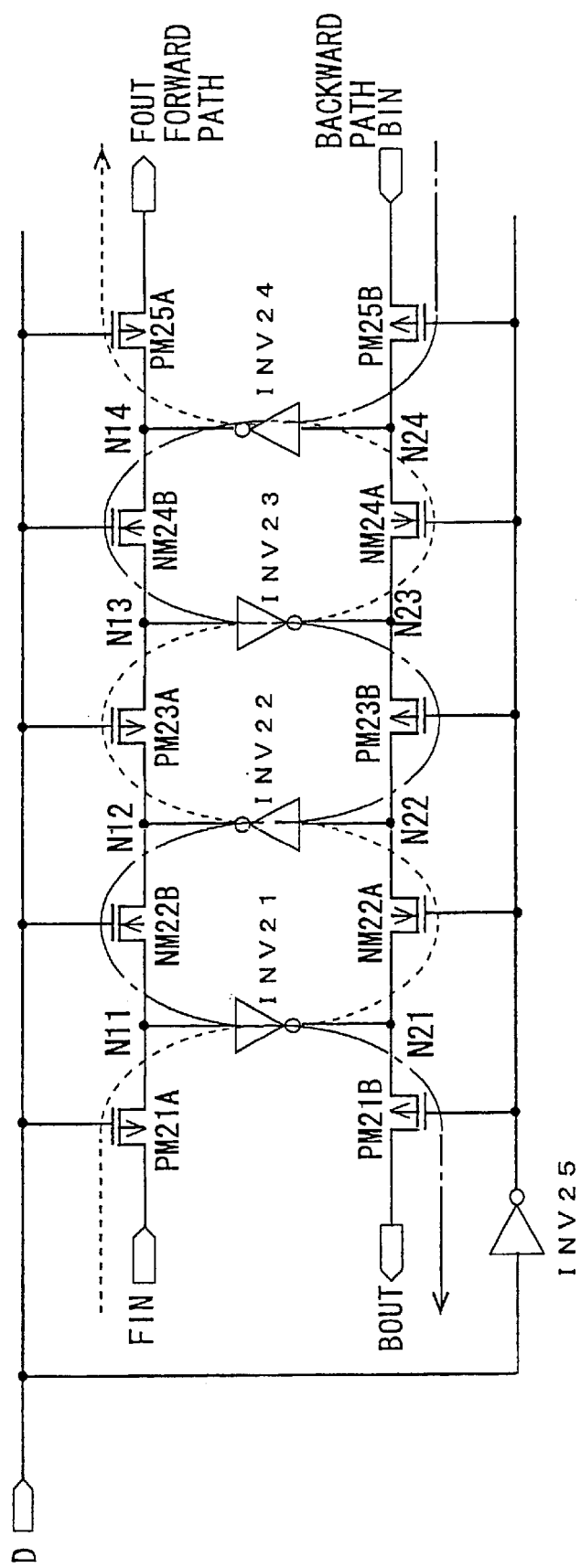
FIG. 2 illustrates the circuit arrangement according to one example of the embodiment of the present invention.
Figure 3:
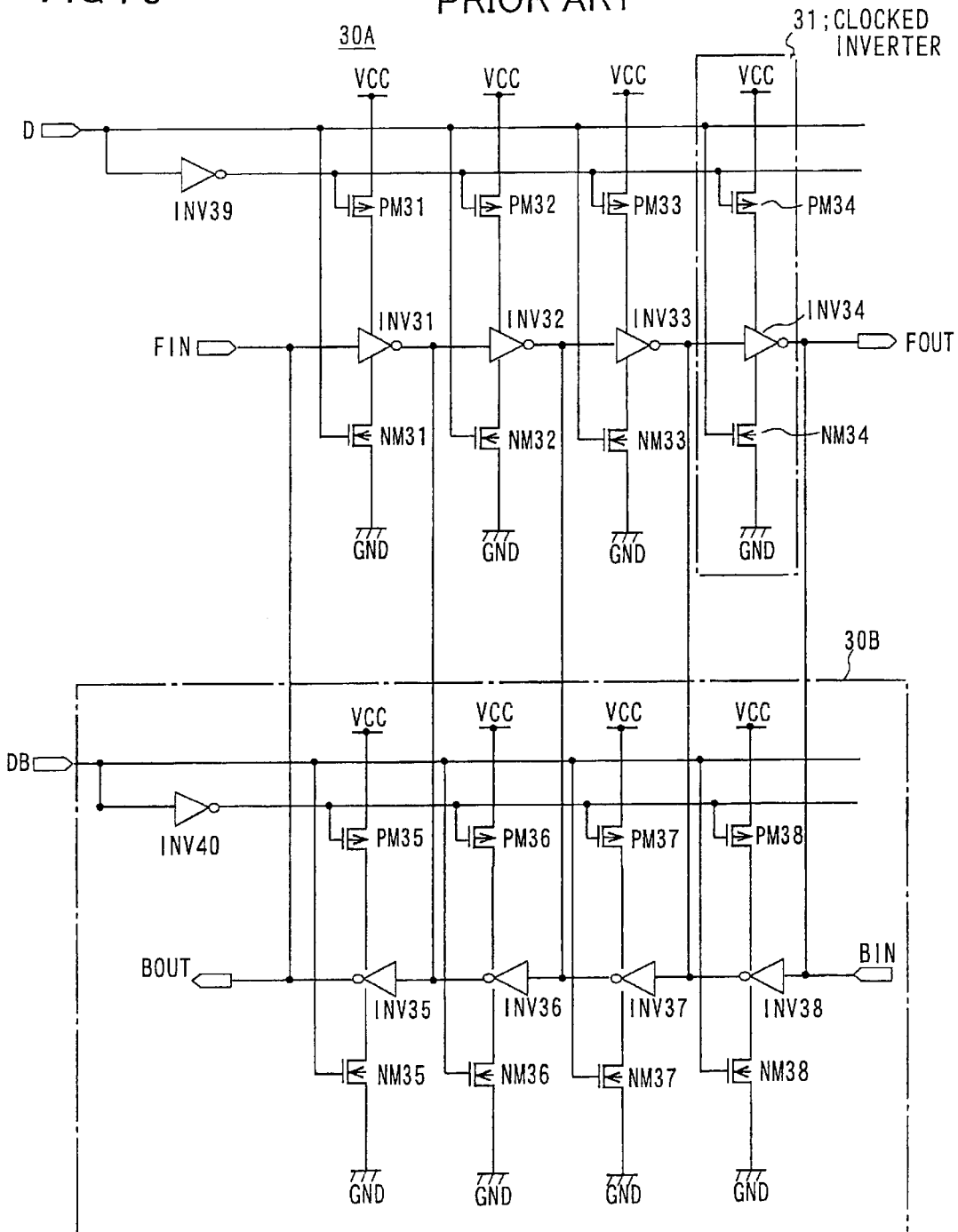
FIG. 3 illustrates one example of the typical prior art delay circuit arrangement.

In a referred embodiment of the present invention shown in FIG. 2, the first group of switching elements includes a first type of switching elements (PM21A, PM23A, PM25A) and a second type of switching elements (NM22B, NM24B) that are connected in series in such a way that any one of the first type of switching elements may be followed by one of the second type of switching elements, alternately one to another, from the first input terminal (FIN) toward the second output terminal (FOUT), and the switching elements of the first type and the switching elements of the second type may be control led on and off, alternately, by the single control signal (D) when it is at an active state.

The second group of switching elements includes a second type of switching elements (PM25B, PM23B, PM21B) and a first type of switching elements (NM24A, NM22A) that are connected in series in such a way that each second type one of switching elements may be followed by first type one of switching elements from the second input terminal (BIN) located on the side of the above-mentioned first output terminal (FOUT) toward the second output terminal (BOUT) located on the side of the above-mentioned input terminal (FIN), and the switching elements of the second type and the switching elements of the first type may be control led on and off, alternately, by the single control signal (D) when it is at an inactive state.

The plurality of amplifier circuit elements includes amplifier circuit elements (INV21 to INV24) that are connected between any one of junction nodes (N11 to N14) connecting the adjacent switching elements in the first group of switching elements and the corresponding one of the junction nodes (N21 to N24) connecting the adjacent switching elements in the second group of switching elements. Specifically, one amplifier circuit element, such as INV21 (forward), has its input terminal connected with the junction node N11 of the corresponding adjacent switching elements (PM21A, NM22B) in the first group of switching elements and its output terminal connected with the junction node N21 of the corresponding adjacent switching elements (PM21B, NM22A) in the second group of switching elements. A second amplifier circuit element, such as INV22 (backward), has its input terminal connected with the junction node N22 of the adjacent switching elements (NM22A, PM23B) in the second group of switching elements and its output terminal connected with the junction node N12 of the adjacent switching elements (NM22B, PM23A) in the first group of switching elements, and the subsequent one of the remaining amplifier circuit elements alternately (forward or backward) is connected in the same manner.

More specifically, the embodiment of the present invention is now described by way of example by referring to the drawings. Referring to FIG. 1, there is shown an example of the arrangement according to this embodiment. As seen from FIG. 1, a first group of switching elements includes a first type of switching elements and a second type switching elements (2A1, 2B2, 2A3, 2B4, 2B5) that are connected in series in such a way that each alternate (every second) one (first type) of the switching elements may be followed by second type one of the switching elements in the order from the first input terminal FIN toward the second output terminal FOUT, and the switching elements of the first type and the switching elements of the second type may be controlled on and off, respectively (i.e., alternatively), by the control signal D and the complementary signal DB that is equivalent to the reversed version of the control signal.

The second group of switching elements includes a second type of switching elements and a first type of switching elements (2B5, 2A4, 2B3, 2A2, 2B1) that are connected in series in such a way that each alternate (every second) one (second type) of the switching elements may be followed by first type one of the switching elements starting from the second input terminal BIN toward the second output terminal BOUT, and the switching elements of the second type and the switching elements of the first type may be controlled off and on, respectively (i.e., alternately), by the complementary signal DB and the control signal D.

A plurality of amplifier circuit elements includes amplifier circuit elements (11, 12, etc.) that are connected between any of the junction nodes of the adjacent switching elements in the first group of switching elements and a corresponding junction node of the adjacent switching elements in the second group of switching elements. Specifically, one amplifier circuit element, such as 11, has its input terminal coupled with the junction node N11 of the adjacent switching elements (2A1, 2B2) in the first group of switching elements and its output terminal coupled with the junction node N21 of the adjacent switching elements in the second group of switching elements (2B1, 2A2). A second amplifier circuit element, such as 12, has its input terminal coupled with the junction node N12 of the adjacent switching in the second group of switching elements (2B2, 2A3) and its output terminal coupled with the junction node N22 of the adjacent switching elements (2A2, 2B3) in the first group of switching elements, and following one and subsequent one of the remaining amplifier circuit elements may be connected alternately in the same manner.

When the control signal D is at an active state, the switching elements of the first type (2A1, 2A2, . . . 2A5) in the first and second groups of switching elements are switched on, allowing the signal applied to the first input terminal FIN pass meanderwise through the active switching elements in the first and second groups and then through the amplifier circuit elements and to be output from the first output terminal FOUT, whereas when the complementary signal DB of the control signal D is at an active state (the control signal D is inactive), the switching elements of the second type (2B1, 2B2, . . . , 2B5) are switched on, allowing the signal applied to the second input terminal BIN to pass meanderwise through the active switching elements of the second type in the first and second groups and then through the amplifier circuit elements and to be supplied from the second output terminal BOUT. In other words, when the switching elements of the first type are switched on by the control signal D, they allow the signal to travel forwardly (forward direction), while when the switching elements of the second type are switched on by the complementary signal DB, they allow the signal to travel reversely (backward direction). Both the forward and backward direction paths are established in a meander fashion by the selected switching on (or off) of the two groups of the switching elements, disposed in parallel to each other.

In FIG. 1, the switching elements (2A1, 2A2, ..., 2A5) of the first type that control led on and off by the control signal D, and the switching elements (2B1, 2B2, ..., 2B5) of the second type that are control led on and off by the complementary signal DB of the control signal D may be implemented by N-type channel MOS transfer gates, and the amplifier circuit elements may be implemented by CMOS inverter circuits. Alternatively, the switching elements (2A1, 2A2, ..., 2A5) of the first type control led by the control signal D, and the switching elements (2B1, 2B2, ..., 2B5) of the second type controlled by the complementary signal DB may be implemented by P-type channel MOS transfer gates. In the circuit arrangement shown in FIG. 1, each of the first and second groups of switching elements includes five stages of switches, and the amplifier circuit elements include four amplifier circuit elements that are connectable in a series fashion via the switching elements. It should be appreciated, however, that the present invention is not limited to the specific arrangement shown in FIG. 1.

There are many possible variations in the manner of selective connection of the components to provide a number of variant meander routes of the paths.

FIG. 2 illustrates the circuit arrangement according to the second embodiment of the present invention. In the circuit arrangement shown in FIG. 2, a first group of switching elements (PM21A, NM22B, PM23A, NM24B, PM25A) that are implemented by P-type channel MOS transfer gates (PM21A, PM23A, PM25A) and N-type channel MOS transfer gates (NM22B, NM24B) are connected in series from a first input terminal FIN toward a first output terminal FOUT in such a way that each first type one of the switching elements may be followed by second (other) type one of the switching elements and that the switching elements of the first type may be switched off while the switching elements of the second type are switched on, under control of the control signal D. A second group of switching elements (PM25B, NM24A, PM23B, NM22A, PM21B) that are implemented by P-type channel MOS transfer gates and N-type channel MOS gates are connected in series from a second input terminal BIN toward a second output terminal BOUT in such a way that first type one of the switching elements may be followed by a second type one of the switching elements and that the switching elements of the one (first) type may be switched off while the switching elements of the other (second) type are switched on, under control of the reversed version of the control signal D that may be provided by an inverter INV25. A plurality of inverter circuits (INV21, 22, 25 ..., 24) are also included, which are connected between the respective junction nodes of the adjacent transfer gates in the first group of switching elements and the respective corresponding junction nodes of the adjacent transfer gates in the second group of switching elements, wherein one of the inverter circuits has its input terminal and output terminal coupled with a junction node of adjacent transfer gates in the first group of switching elements and with the junction node of the adjacent transfer gates in the second switching elements, respectively; with subsequent one of the remaining inverter circuits having its input terminal and output terminal coupled with the junction node of the adjacent transfer gates in the second group of switching elements and with the junction node of the adjacent transfer gates in the first group of switching elements, respectively.

When the control signal D is at Low level, it causes the P-type channel MOS transfer gates and N-type channel MOS transfer gates PM21A, NM22A, PM23A, NM24A, PM25A in the first (A) group to be switched on, to establish a first meander path that allows the signal applied to the first input terminal FIN to appear on the first output terminal FOUT. The first meander path is established: FIN-PM21A-INV21-NM22A-INV22-PM23A-INV23-NM24A-INV24-PM25A-FOUT. When the control signal D is at High level, it causes the P-type channel MOS transfer gates and N-type channel MOS transfer gates PM21B, NM22B, PM23B, NM24B, PM25B in the second (B) group to be switched on, allowing the signal applied to the second input terminal BIN to appear on the second output terminal BOUT. In this case a second meander path is established: BIN-PM25B-INV24B-INV23-PM23B-INV22-NM22B-INV21-PM21B-BOUT.

It may be appreciated from the foregoing description that the circuit arrangement according to the embodiment of the present invention allows the individual inverters forming the respective delay elements to be shared by the clock signal traveling in the forward and backward directions, thus reducing the number of transistors to half the number of transistors used in the conventional circuit arrangement. Although the circuit arrangement according to the present invention includes five stages of transfer gate sequences and four inverter circuits connectable in a series fashion (via switching elements), it should be understood that the present invention is not limited to such specific circuit arrangement.

In the delay circuits shown in FIG. 1 and FIG. 2, respectively, a portion of the clock signal that is equivalent to a negative delay may previously be passed, e.g., within a clock period of the two consecutive clock periods, by traveling in the forward direction through the delay circuit sequence, following which the clock signal may be allowed to travel in the backward direction during the remaining one period, by a time equal to the forward traveling time. Thus, a delay time that is equal to the clock period minus the negative delay portion may be provided.

Figure 4:
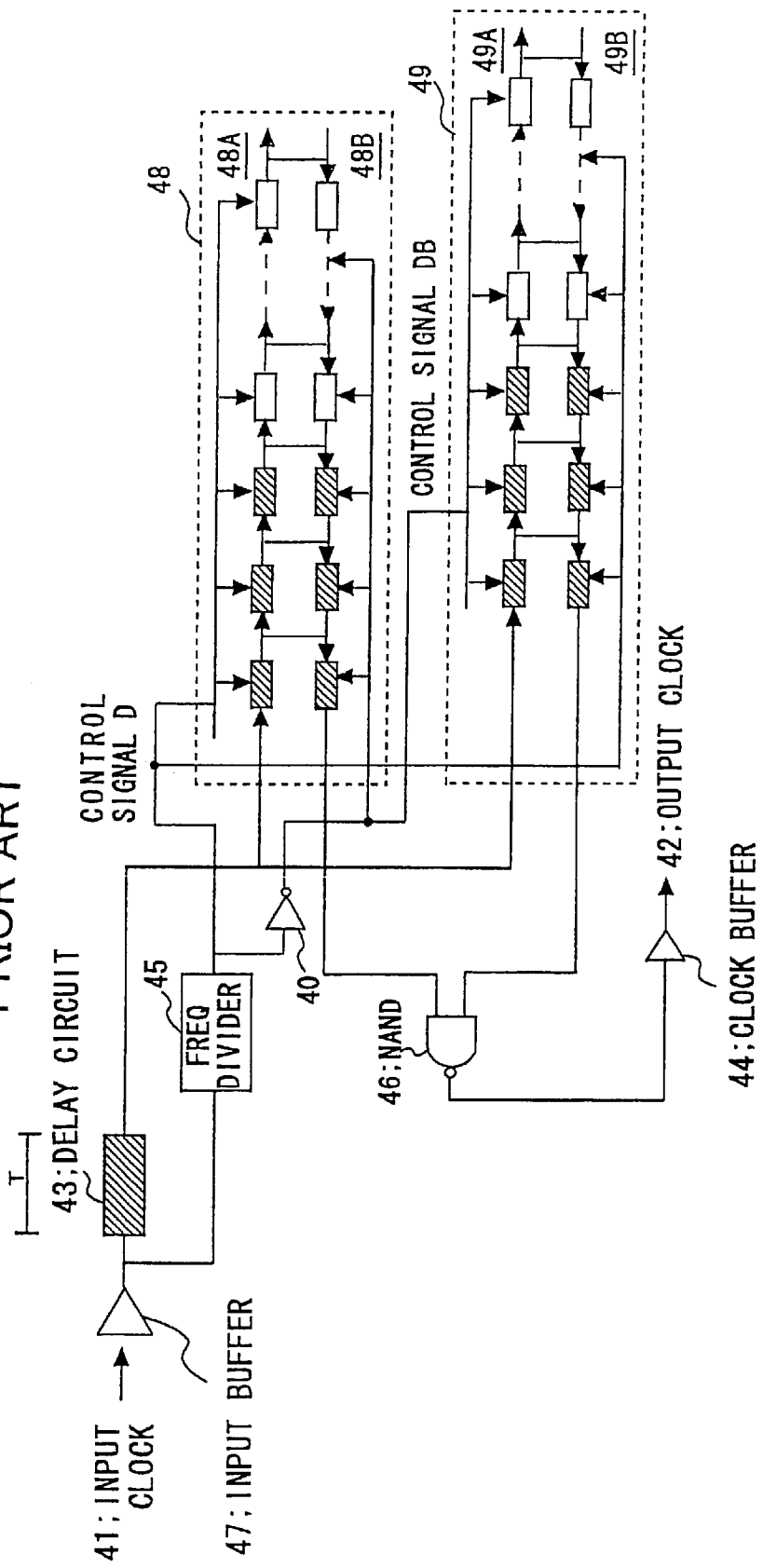
FIG. 4 illustrates the arrangement of the prior art synchronous delay circuit.
Figure 5:
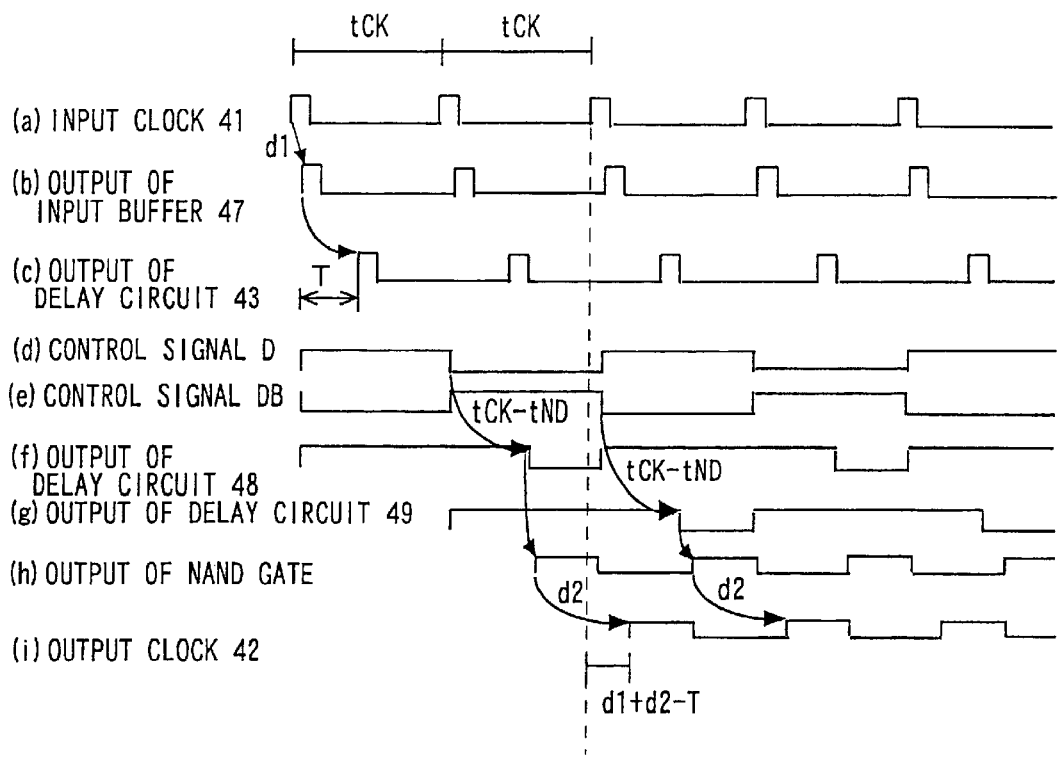
FIG. 5 is a timing chart diagram for the prior art synchronous delay circuit.
Figure 6:
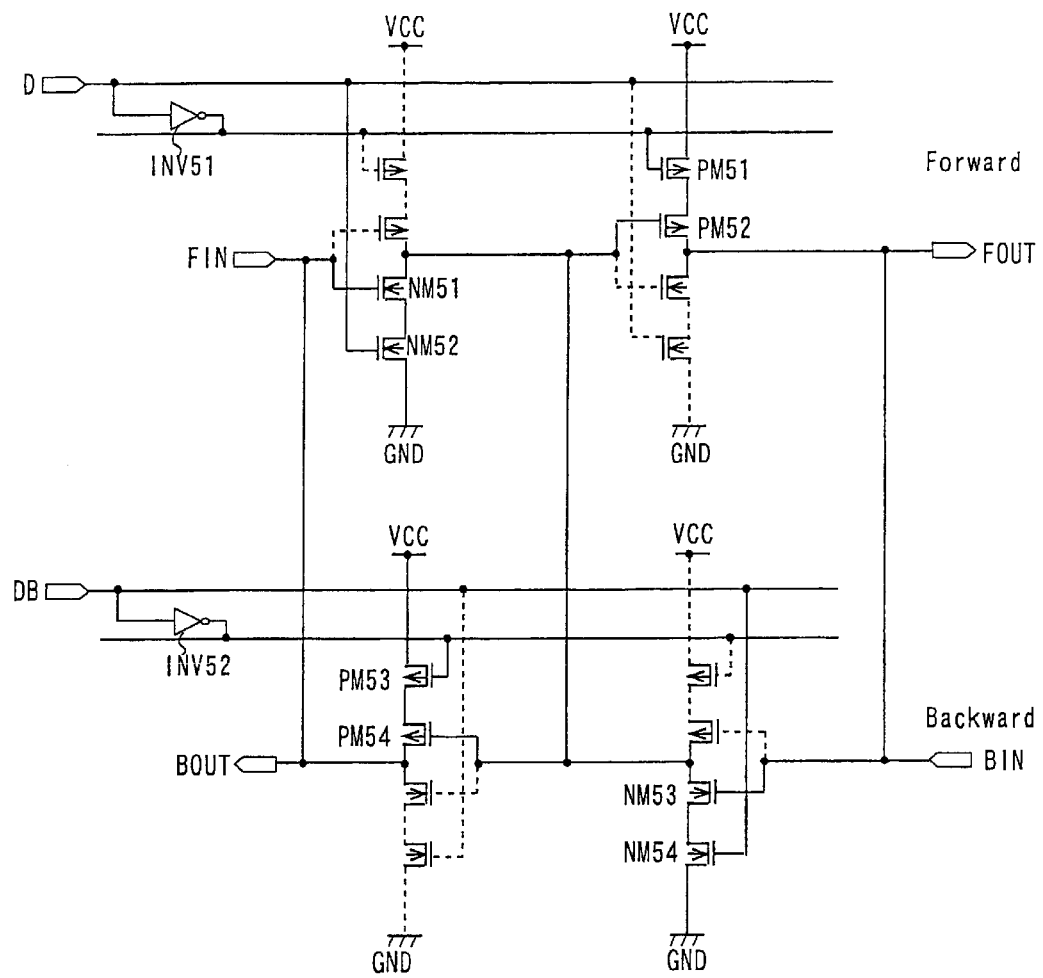
FIG. 6 illustrates one example of the prior art delay circuit (part 1)
Figure 7:
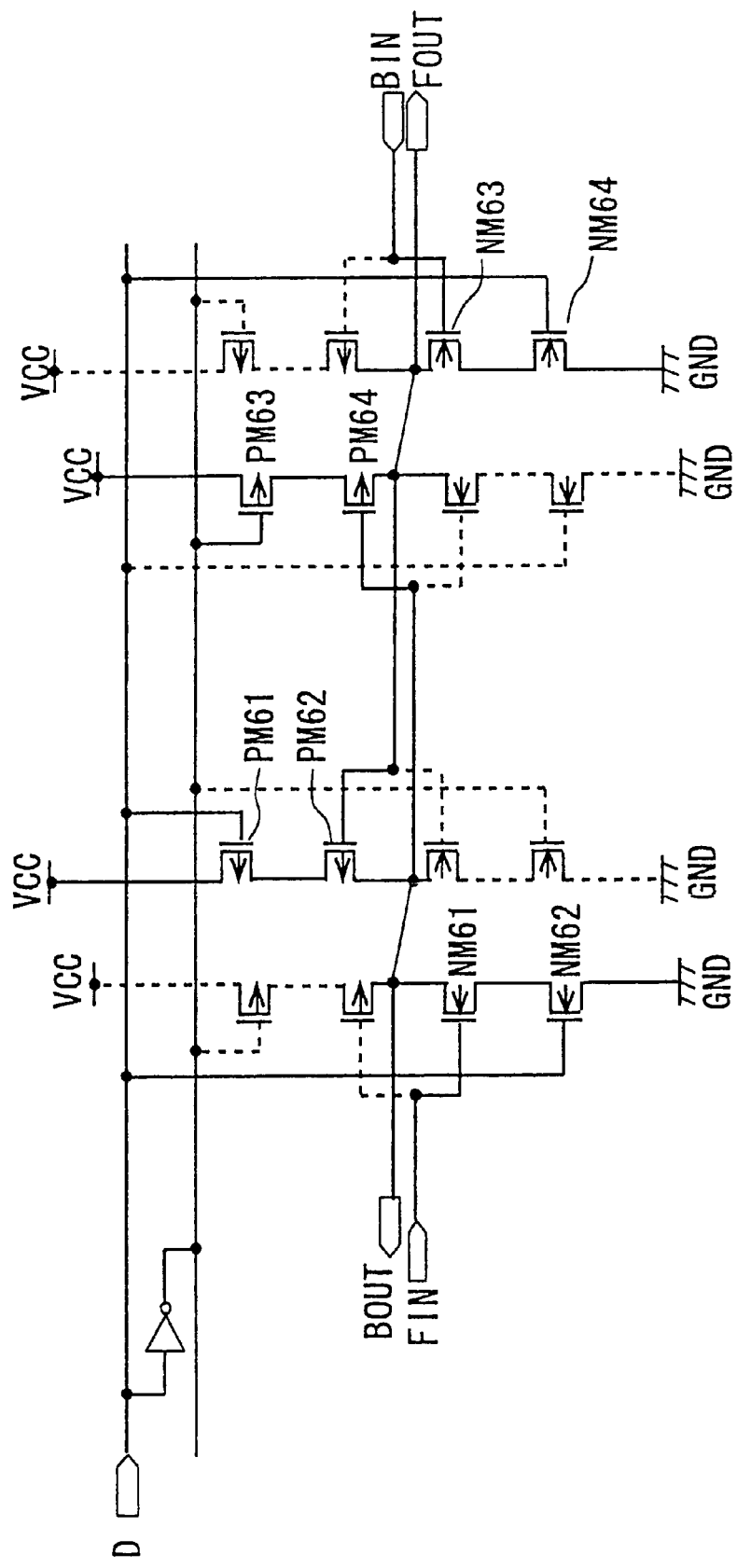
FIG. 7 illustrates one example of the prior art delay circuit (part 2)
Figure 8:
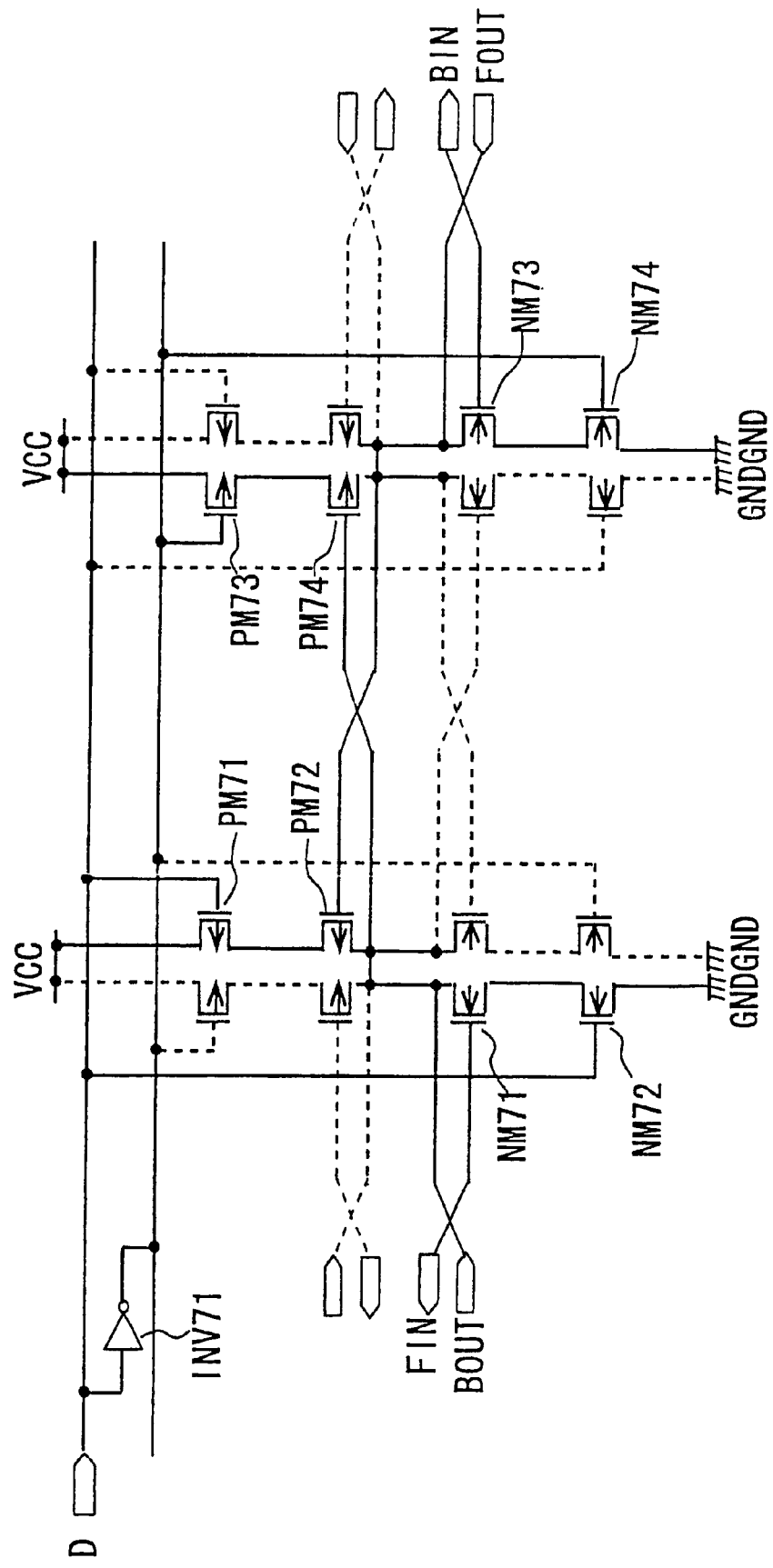
FIG. 8 illustrates one example of the prior art delay circuit (part 3)
Figure 9:
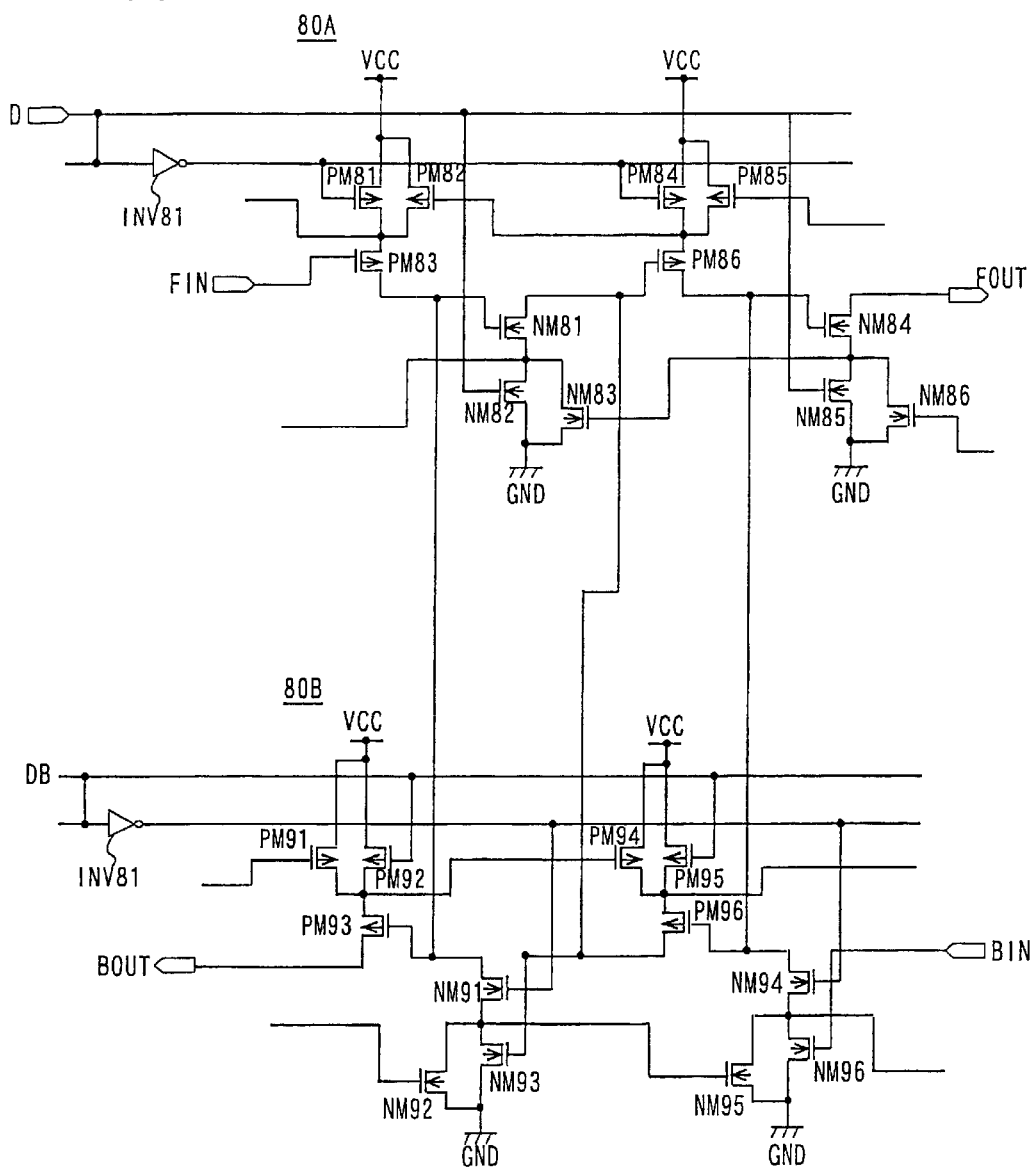
FIG. 9 illustrates one example of the prior art delay circuit.

The delay circuit shown in FIG. 1 may be employed as the first and second delay circuits 48, 49 in FIG. 4. For example, the delay circuit arrangement may include the first and second delay circuits each formed by the delay circuit of FIG. 1, an input buffer circuit 47 that receives a clock signal as input, a third delay circuit 43 that delays an output of the input buffer circuit 47, and a frequency divider 45 that divides an output of the input buffer circuit 47 by half, wherein an output of the frequency divider 45 and its reversed version may be fed to the first and second delay circuits 48, 49 as the control signal D and its complementary signal DB, respectively, and an output of the third delay circuit 43 may be fed to the first input terminals of the first and second delay circuits 48, 49. Additionally, it may include NAND gate 46 to which the respective output signals provided from the respective second output terminals (BOUT) of the first and second delay circuits may be applied, and a clock buffer circuit 44 that receives the output of the NAND gate 46 and provides an output clock 42 that may be fed to the appropriate clocking destination. In this case, the delay time for the first and second delay circuits may be set equal to the sum of the delay time of the input buffer circuit 47 and the delay time of the clock buffer circuit 44, respectively. It is also noted that when the circuit of FIG.

2 is employed as the first and second delay circuits 48, 49, the output of the frequency divider 45 may be fed to the first delay circuit 48 as the control signal, and the inversed version of the control signal that is provided by the inverter 40 may be fed to the second delay circuit as the complementary signal.

According to the second embodiment of the present invention, the size of the transistors (channel width for MOS transistor) that provides the current path in forward and backward directions in the same circuit arrangement as for the first embodiment may be varied to have a predetermined ratio.

This allows the delay time along the forward path (forward direction) and the backward path (reverse direction) to be proportional to the size of the transistor, which may provide a duty cycle of, e.g., 50%.

The meritorious effects of the present invention are summarized as follows.

It may be understood from the foregoing description that the present invention provides a simplified delay circuit arrangement that allows the signal traveling direction to be switched between the forward direction and the backward direction, and that includes the amplifier circuit elements in the form of the unitary delay elements that can be shared by the control signal traveling in the forward direction and in the backward direction. Advantageously, this can reduce the physical size or area of the chip on which those elements may be mounted, and those elements may provide the consistent delay characteristics.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A clock signal control method for a delay circuit, comprising the steps of:
   providing a delay circuit comprising a plurality of amplifier circuit elements each amplifying a clock signal applied thereto; and a plurality of switching elements each switching passage of the clock signal on and off,
   connecting said plurality of amplifier circuit elements in a series fashion through said switching elements that are switched on; and
   selecting said switching elements that are switched on, thereby allowing a direction in which the clock signal is traveling through said plurality of amplifier circuit elements connected in a series fashion to be switched between a forward direction and a backward direction.

2. The method as defined in claim 1, wherein said switching elements are disposed in parallel two lines with said amplifier circuit elements intervening between said two lines, and wherein any of said forward and backward directions is selected by selectively establishing a meander-like path of the series fashion.

3. The method as defined in claim 1, wherein one of the two directions is established by connecting adjacent two of said amplifier circuit elements via one of said switching elements selected to be ON to form one meander-like path, while the other of the two direction is established by connecting said adjacent two amplifier circuit elements via another one of said switching elements selected to be ON disposed opposing to said one of said switching elements now selected to be OFF.

4. A clock signal control circuit comprising:
   a plurality of amplifier circuit elements each amplifying a clock signal applied thereto; and
   a plurality of switching elements each switching passage of the clock signal on and off, wherein
   said plurality of amplifier circuit elements are connected in a series fashion through said switching elements that are switched on; and
   said switching elements that are switched on are selected, thereby allowing a direction in which said clock signal is traveling through said plurality of amplifier circuit elements to be switched between a forward direction and a backward direction.

5. The clock signal control circuit as defined in claim 4, wherein
   said amplifier circuit element comprises an inverter circuit; and
   said switching element comprises a MOS semiconductor switch.

6. The clock signal control circuit as defined in claim 4, wherein said switching element comprises N-type channel MOS transfer gate and P-type channel MOS transfer gate, said transfer gates being controlled on and off according to the direction in which the clock signal is traveling.

7. The clock signal control circuit as defined in claim 4, wherein said switching elements are disposed in parallel two lines with said amplifier circuit elements intervening between said two lines, and wherein any of said forward and backward directions is selected by selectively establishing a meander-like path of the series fashion.

8. The clock signal control circuit as defined in claim 4, wherein one of the two directions is established by connecting adjacent two of said amplifier circuit elements via one of said switching elements selected to be ON to form one meander-like path, while the other of the two direction is established by connecting said adjacent two amplifier circuit elements via another one of said switching elements selected to be ON disposed opposing to said one of said switching elements now selected to be OFF.

9. A delay circuit comprising:
   (a) a first group of switching elements connected in series between a first input terminal and a first output terminal and including switching elements alternately controlled to be switched on and off by a control signal, or by said control signal and a complementary signal thereof for switching passage of a clock signal on and off;
   (b) a second group of switching elements connected in series between a second input terminal and a second output terminal and including switching elements alternately controlled to be switched on and off by the control signal, or by said control signal the complementary signal thereof for switching passage of the clock signal on and off; and
   (c) a plurality of amplifier circuit elements connected between the respective junction nodes of the adjacent switching elements of the first group and the respective corresponding junction nodes of the adjacent switching elements of the second group in such a way that one of said plurality amplifier circuit elements is connected forwardly or reversely alternately one to another,
   (d) wherein said plurality of amplifier circuit elements are connected in a series fashion through said switching elements that are switched on, and are shared by respective signal paths (i) between said first input terminal and said first output terminal and (ii) between said second input terminal and said second output terminal, and (e) wherein a direction in which the clock signal is traveling along said respective signal paths may be switched between a first direction from said first input terminal toward said first output terminal and a second direction from said second input terminal toward said second output terminal, by selecting said switching elements that are switched on.

10. A synchronous delay circuit comprising a first delay circuit and a second delay circuit, each delay circuit as defined in claim 9, the first and second delay circuits being control led by the control signal so that the direction in which a clock signal is traveling may be switched between the forward direction and the backward direction, said synchronous delay circuit including:
- an input buffer circuit to which an input clock signal is applied;
- a third delay circuit configured for delaying an output of said input buffer circuit;
- a frequency divider configured for dividing the output of said input buffer circuit by half,
- an output of said frequency divider and its reversed version being fed to said first and second delay circuits as the control signal and the complementary signal thereof, respectively, and an output of said third delay circuit being fed to said respective first input terminals of said first and second delay circuits;
- a logical gate circuit to which the output signals of said first and second delay circuits provided through their respective output terminals are applied; and
- an output buffer circuit to which an output of said logical gate circuit is applied and which provides an output clock to be fed to appropriate clocking destination.

11. A delay circuit comprising:
(a) a first group of switching elements including a first type of switching elements and a second type of switching elements controlled to be switched on and off by a control signal and a complementary signal thereof, said switching elements of the first type and said switching elements of the second type being connected in series from a first input terminal toward a first output terminal such that each switching element of one type is followed by each switching element of the other type in an alternate manner;
(b) a second group of switching elements including a second type of switching elements and a first type of switching elements controlled to be switched on and off by the control signal and the complementary signal thereof, said switching elements of the second type and said switching elements of the first type being connected in series from a second input terminal located on the side of said first input terminal toward a second output terminal located on the side of said first output terminal such that each switching element of one type is followed by each switching element of the other type in an alternate manner; and
(c) a plurality of amplifier circuit elements connected between each respective junction node of the adjacent switching elements in said first group of switching elements and each respective corresponding junction node of the adjacent switching elements in the second group of switching elements, each alternate one of said plurality of amplifier circuit elements having its input terminal and its output terminal connected (i) between said each respective junction node of the adjacent switching elements in said first group of switching element and said each respective junction node of the adjacent switching elements in said second group of switching elements and (ii) between said each respective junction node of the adjacent switching elements in said second group of switching elements and said each respective junction node of the adjacent switching elements in said first group of switching elements, respectively.

12. The delay circuit as defined in claim 11, wherein
(i) when said control signal is active, it causes the switching elements of the first type to be switched on, allowing the clock signal applied to said first input terminal to travel from said first input terminal toward said first output terminal through said switching elements of the first type that are switched on and said amplifier circuit elements, and
(ii) when the complementary signal of said control signal is active, it causes the switching elements of the second type to be switched on, allowing the clock signal applied to said second input terminal to travel from said second input terminal toward said second output terminal through said switching elements of the second type that are switched on and said amplifier circuit elements.

13. The delay circuit as defined in claim 11, wherein
(d) said first group of switching elements are connected in series between said first input terminal and said first output terminal through a first-stage switching element of the first type, followed by a second-stage switching element of the second type, followed further in an alternate fashion, and finally followed by a final-stage switching element of the first type; and
(e) said second group of switching elements are connected in series between said second input terminal and said second output terminal through a first-stage switching element of the second type, followed by a second-stage switching element of the first type, followed further in an alternate fashion, and finally followed by a final-stage switching element of the second type, (f) wherein
(i) when said control signal is active, it causes the switching element of the first type in the first and second group of switching elements to be switched on, allowing the clock signal applied to said first input terminal to travel through said switching elements of the first type thus switched on and through said amplifier circuit elements and then appear on said first output terminal, and
(ii) when the complementary signal of said control signal is active, it causes the switching elements of the second type in the first and second group of switching elements to be switched on, allowing the clock signal to travel through said switching elements of the second type and through said amplifier circuit elements and appear on said second output terminal.

14. A synchronous delay circuit comprising: a first delay circuit and a second delay circuit, each delay circuit as defined in claim 11, the first and second delay circuits being controlled by the control signal so that the direction in which a clock signal is traveling may be switched between the forward direction and the backward direction, said synchronous delay circuit including:
- an input buffer circuit to which an input clock signal is applied;
- a third delay circuit configured for delaying an output of said input buffer circuit;
- a frequency divider configured for dividing the output of said input buffer circuit by half, an output of said frequency divider and its reversed version being fed to said first and second delay circuits as the control signal and the complementary signal thereof, respectively, and an output of said third delay circuit being fed to said respective first input terminals of said first and second delay circuits;

a logical gate circuit to which the output signals of said first and second delay circuits provided through their respective output terminals are applied; and an output buffer circuit to which an output of said logical gate circuit is applied and which provides an output clock to be fed to appropriate clocking destination.

15. A delay circuit comprising:
(a) a first group of switching elements including a first type of switching elements and a second type of switching elements controlled to be switched on and off by a control signal when it is active, each alternate one of said switching elements of the first type and said switching elements of the second type being connected in series between a first input terminal and a first output terminal along this direction;
(b) a second group of switching elements including a second type of switching elements and a first type of switching elements controlled to be switched on and off, respectively, by the control signal when it is inactive, each alternate one of said switching elements of the second type and said switching elements of the first type being connected in series between a second input terminal located on the side of said first output terminal and a second output terminal located on the side of said first input terminal along this direction; and
(c) a plurality of amplifier circuit elements connected between each respective junction node of the adjacent switching elements in said first group of switching elements and each respective corresponding junction node of the adjacent switching elements in the second group of switching elements, each alternate one of said plurality of amplifier circuit elements having its input terminal and its output terminal connected in an alternate fashion, (i) between said each respective junction node of the adjacent switching elements in said first group of switching element and said each respective junction node of the adjacent switching elements in said second group of switching elements and (ii) between said each respective junction node of the adjacent switching elements in said second group of switching elements and said each respective junction node of the adjacent switching elements in said first group of switching elements, respectively.

16. A synchronous delay circuit comprising: a first delay circuit and a second delay circuit, each delay circuit as defined in claim 15, the first and second delay circuits being controlled by the control signal so that the direction in which a clock signal is traveling may be switched between the forward direction and the backward direction, said synchronous delay circuit including:
an input buffer circuit to which an input clock signal is applied
a third delay circuit configured for delaying an output of said input buffer circuit;
a frequency divider configured for dividing the output of said input buffer circuit by half,
an output of said frequency divider and its reversed version being fed to said first and second delay circuits as the control signal and the complementary signal thereof, respectively, and an output of said third delay circuit being fed to said respective first input terminals of said first and second delay circuits;
a logical gate circuit to which the output signals of said first and second delay circuits provided through their respective output terminals are applied; and
an output buffer circuit to which an output of said logical gate circuit is applied and which provides an output clock to be fed to appropriate clocking destination.

17. A delay circuit comprising:
(a) a first group of switching elements including P-type channel MOS transistors and N-type channel MOS transistors connected in series between a first input terminal and a first output terminal in such a way that each alternate one of the transistors of one type is followed by each alternate one of the transistors of the other type, and controlled so that the transistors of the one type may be turned off when the transistors of the other type are turned on, in accordance with a predetermined value of a control signal;
(b) a second group of switching elements including P-type channel MOS transistors and N-type channel MOS transistors connected in series between a second input terminal located on the side of said first output terminal and a second output terminal located on the side of said first input terminal in such a way that each alternate one of the transistors of one type is followed by each alternate one of the transistors of the other type, and control led so that the transistors of the one type may be turned off when the transistors of the other type are turned on, in accordance with a predetermined value of a complementary signal of said control signal that is reversed by an inverter; and
(c) a plurality of inverter circuits connected between each respective junction node of the adjacent transistors in said first group of switching elements and each respective corresponding junction node of the adjacent transistors in the second group of switching elements, each alternate one of said plurality of inverter circuits having its input terminal and its output terminal connected, in an alternate fashion, (i) between said each respective junction node of the adjacent transistors in said first group of switching element and said each respective junction node of the adjacent transistors in said second group of switching elements and (ii) between said each respective junction node of the adjacent transistors in said second group of switching elements and said each respective junction node of the adjacent transistors in said first group of switching elements, respectively.

18. The delay circuit as defined in claim 17, wherein those transistors connected in series along a forward signal traveling path from said first input terminal toward said first output terminal, and those transistors connected in series along a backward signal traveling path from said second input terminal toward said second output terminal have different current driving capabilities.

19. A synchronous delay circuit comprising: a first delay circuit and a second delay circuit, each delay circuit as defined in claim 17, the first and second delay circuits being control led by the control signal so that the direction in which a clock signal is traveling may be switched over between the forward direction and the backward direction, said synchronous delay circuit including:
an input buffer circuit to which an input clock signal is applied;

a third delay circuit configured for delaying an output of said input buffer circuit;

a frequency divider configured for dividing the output of said input buffer circuit by half, an output of said frequency divider and its inversed version being fed to said first and second delay circuits as the control signal and the complementary signal thereof, respectively, and an output of said third delay circuit being fed to said respective first input terminals of said first and second delay circuits;

a logical gate circuit to which the output signals of said first and second delay circuits provided through their respective output terminals are applied; and an output buffer circuit to which an output of said logical gate circuit is applied and which provides an output clock to be fed to appropriate clocking destination.

\* \* \* \* \*